United States Patent
Köck

(10) Patent No.: US 6,459,257 B1
(45) Date of Patent: Oct. 1, 2002

(54) MEASURING SYSTEM FOR MEASURING POWER AND/OR POWER FACTORS AT AT LEAST ONE MEASURING POINT IN AN A.C. VOLTAGE NETWORK

(75) Inventor: Gerd Köck, Ditzingen (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 09/486,785

(22) PCT Filed: Aug. 20, 1998

(86) PCT No.: PCT/DE98/02429

§ 371 (c)(1),
(2), (4) Date: May 22, 2000

(87) PCT Pub. No.: WO99/12047

PCT Pub. Date: Mar. 11, 1999

(30) Foreign Application Priority Data

Sep. 1, 1997 (DE) .......................... 197 38 140

(51) Int. Cl.⁷ .................. G01R 11/32; G01R 23/16; G01R 25/00; G01R 21/00
(52) U.S. Cl. ............... 324/142; 324/76.12; 324/76.77; 702/60; 702/61; 702/62
(58) Field of Search ............... 324/547, 141, 324/142, 76.12, 76.77, 102, 130; 702/60, 61, 62

(56) References Cited

U.S. PATENT DOCUMENTS

| | | | |
|---|---|---|---|
| 4,240,149 A | * 12/1980 | Fletcher et al. | 702/60 |
| 4,672,555 A | * 6/1987 | Hart et al. | 700/66 |
| 4,979,122 A | * 12/1990 | Davis et al. | 702/66 |
| 5,051,616 A | * 9/1991 | Stuchbury | 327/79 |
| 5,122,735 A | * 6/1992 | Porter et al. | 324/142 |
| 5,151,866 A | * 9/1992 | Glaser et al. | 702/66 |
| 5,170,115 A | * 12/1992 | Kashiwabara et al. | 324/142 |
| 5,229,713 A | * 7/1993 | Bullock et al. | 324/142 |
| 5,243,536 A | * 9/1993 | Bradford | 702/60 |
| 5,302,890 A | * 4/1994 | McEachern et al. | 324/142 |
| 5,469,049 A | * 11/1995 | Briese et al. | 324/76.77 |
| 5,483,153 A | * 1/1996 | Leeb et al. | 324/76.12 |
| 5,485,393 A | * 1/1996 | Bradford | 702/60 |
| 5,498,954 A | * 3/1996 | Bassett et al. | 323/340 |
| 5,606,510 A | * 2/1997 | Glasner et al. | 702/60 |
| 5,631,554 A | * 5/1997 | Briese et al. | 324/76.77 |

FOREIGN PATENT DOCUMENTS

| | | |
|---|---|---|
| DE | 40 02 832 | 8/1990 |
| DE | 44 03 642 | 12/1994 |
| EP | 0 591 942 | 4/1994 |
| EP | 0 853 364 | 7/1998 |
| WO | 94/03818 | 2/1994 |

* cited by examiner

Primary Examiner—N. Le
Assistant Examiner—Wasseem H. Hamdan
(74) Attorney, Agent, or Firm—Morrison & Foerster LLP

(57) ABSTRACT

To minimize the outlay for circuit engineering in a measuring system having at least one measuring instrument for measuring power and/or power factors at least one measuring point in an a.c. voltage network, a voltage transformer device having in each case one voltage transformer for each phase of the a.c. voltage network is arranged at a voltage-detection site of the a.c. voltage network. In addition, a current transformer for each phase is arranged at each measuring point, and to connect a measuring instrument assigned is connected to the particular measuring point at a current transformer input. The voltage transformer device and all measuring instruments are interconnected via a shared data-transmission device, in which predefined information on the detected voltages is digitally transmitted to the measuring instruments.

3 Claims, 1 Drawing Sheet

MEASURING SYSTEM FOR MEASURING POWER AND/OR POWER FACTORS AT AT LEAST ONE MEASURING POINT IN AN A.C. VOLTAGE NETWORK

BACKGROUND INFORMATION

To measure power and/or power factors at different measuring points in a.c. voltage networks, in particular at feed-in points and branches, for example of a switching station, appropriate measuring instruments, e.g., instruments for measuring network quality, are configured at these locations, these instruments usually having voltage transformer inputs and current transformer inputs. Current transformers, which are connected at the current transformer inputs of the measuring instrument there, are provided for the individual phases, at the measuring (monitoring) points. The voltage transformer inputs of the measuring instruments arranged at the various measuring points are connected via lines to voltage transformers, which are arranged at a central voltage detecting site in the a.c. voltage network, e.g., in the bus bars in a switching station. The transmission of voltages from the voltage detecting site to the individual measuring instruments at the measuring points is influenced, particularly in the case of large switching stations, by interference in the form of noise, injection of external signals, and voltage displacements caused by ground-fault currents. In addition, the outlay for circuit engineering is very high, because of the necessity for the voltage transformer inputs at each measuring instrument and the lines for transmitting voltage from the voltage transformers at the voltage detection site to the individual measuring instruments. This applies correspondingly when voltage transformers are provided for each phase, instead of at each individual measuring point.

SUMMARY

An object of the present invention is to reduce the circuit engineering outlay needed for measuring power and/or power factors at a plurality of measuring points in an a.c. voltage network.

The object is achieved in accordance with the present invention by providing a measuring system having at least one measuring instrument for measuring power and/or power factors at least one measuring point in an a c. voltage network, a voltage transformer device having in each case one voltage transformer for each phase of the a c. voltage network being arranged at a voltage detecting site of the a.c. voltage network. In addition, a current transformer for each phase is mounted at each measuring point and connected at a current transformer input of a measuring instrument allocated to the particular measuring point. The voltage transformer device and all measuring instruments are interconnected via a shared data transmission device, in which predefined information on the detected voltages is transmitted digitally to the measuring instruments.

One essential advantage of the measuring system according to the present invention, with respect to its measuring instruments, is that in contrast to equivalent measuring instruments under the state of the art, the need is eliminated in each case for voltage transformer inputs and their requisite downstream electronics and associated cabling. Instead, the information pertaining to the voltages of the a.c. voltage network required for measuring power and/or power factors, is transmitted digitally from the voltage-detection site to the individual measuring instruments. In this context, the information can be transmitted via an internal bus, a fiber-optic network, or as a wireless communication.

The digitally transmitted, predefined information on the detected voltages preferably includes the voltage values and the period duration. In this context, the detection time of the network period is determined very precisely to enable the power and/or power factors to be measured with high precision in the individual measuring instruments. Moreover, the measuring instruments is very precisely time-synchronized to avoid phase errors. To compensate for phase deviations between the voltage transformers and the current transformers at the various measuring points, the phase deviation is determined for each measuring instrument in a calibration operation, the phase-angle error preferably being input into a memory of the measuring instrument; on the basis of the stored phase-angle error, the measuring instrument automatically compensates the phase-angle deviation. To determine the phase-angle error, square-wave signals, for example, are fed to the measuring instrument via the current transformer inputs and the data-transmission device, the phase-angle error being defined in terms of the digitally transmitted voltage information, over the harmonic component.

Preferably configured at the voltage-detection site is a further measuring instrument having voltage transformer inputs, where the voltage transformers are connected, the additional measuring instrument being designed to generate the predefined information on the detected voltages. Thus, everywhere in the measuring system, the same measuring instruments are used, which are advantageously distinguished from conventional measuring instruments in that one of the measuring instruments, namely that at the voltage-detection site, does not have any current-transformer inputs, and the remaining measuring instruments do not have any voltage transformer inputs.

BRIEF DESCRIPTION OF THE DRAWINGS

The FIGURE shows an example of a measuring system according to the present invention.

DETAILED DESCRIPTION

Figure 1:
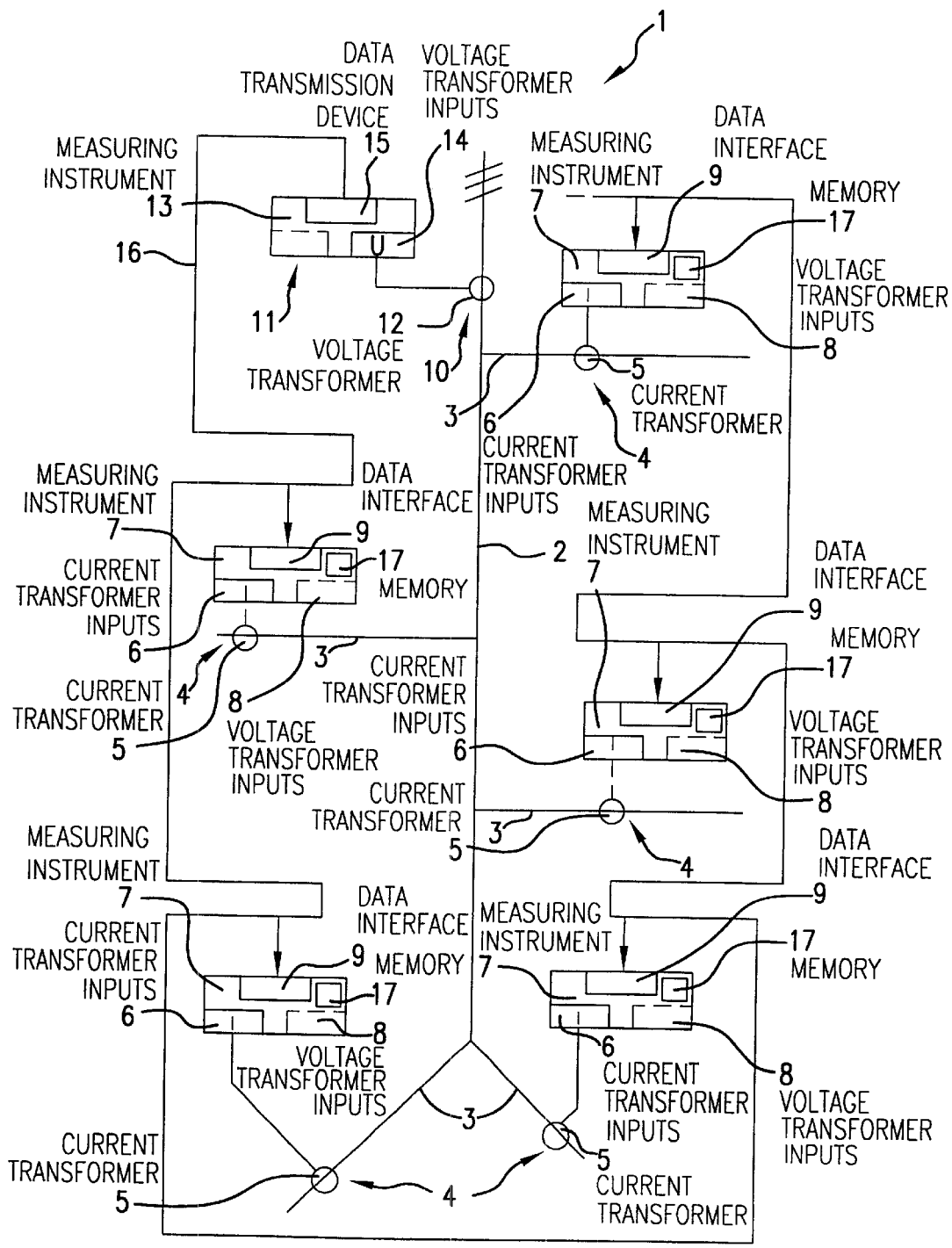

For each phase, an a.c. voltage network 1, for example a switching station, has a bus bar 2 having a plurality of branches 3, where the power and/or power factor are to be measured. For this, current transformers 5 for the various phases are arranged at each branch 3, at a measuring site 4, current transformers 5 being connected at current transformer inputs 6 of a measuring instrument 7 arranged in the area of the particular measuring site 4, for measuring power and/or power factors. The measuring instruments denoted by 7 correspond to known, related-art measuring instruments, the distinction, as shown here by dotted lines, being the absence of voltage transformer inputs 8 and their corresponding electronics, a data interface 9 being provided instead for receiving digital voltage information.

Configured at a central voltage-detection site 10 of a.c. voltage network 1, here at bus bars 2, is a voltage transformer device 11, made up of voltage transformers 12 for the various phases, and of an additional measuring instrument 13. The additional measuring instrument 13 is distinguished from those measuring instruments designated by 7 by the lack of current transformer inputs 6; instead, voltage transformer inputs 14 are present where voltage transformers 12 are connected. As in the case of related-art measuring instruments, the detected voltages are preprocessed (conditioned) in measuring instrument 13 for measuring power and/or power factors; in contrast to the known measuring instruments, predefined information on the detected voltages is transmitted digitally via a data interface 15 and a bus 16 connected thereto, to the other measuring instruments 7, which, for this, are connected by their data interfaces 9 at bus 16.

To enable the power to be determined with substantial accuracy, phase deviations between voltage transformers 12 and current transformers 5 must be compensated, and the detecting time of the network (line) period is ascertained very precisely; measuring instruments 7, 13 is time-synchronized very exactly, to avoid phase errors. This is made possible by a very rapid transmission of the digital voltage information with a time error of <1 µs, which makes it possible to achieve a phase error of <1 min, in terms of 50 Hz. To compensate for the phase deviations between voltage transformers 12 and current transformers 5, the phase deviation for each individual measuring instrument 7 is determined in a calibration operations, the phase-angle error being input into a memory 17 of the particular measuring instrument 7; measuring instrument 7 then automatically compensates for the phase-angle deviation on the basis of the stored phase-angle error. To determine the phase-angle error, square-wave signals are fed to measuring instrument 7 via current transformer inputs 6 and data transmission device 9, 15, 16, the phase-angle error being defined in terms of the digitally transmitted voltage information, over a harmonic component.

What is claimed is:

1. A measuring system, comprising:
   a plurality of at least two measuring instruments for measuring power and/or power factors, each corresponding to one of a plurality of at least two measuring points in an ac voltage network;
   a voltage transformer device having a respective voltage transformer for each phase of the ac voltage network arranged at a voltage-detection site of the ac voltage network;
   a current transformer for each phase of the ac voltage network arranged at each one of the measuring points, a first of the plurality each of the measuring instruments being assigned to one of the corresponding measuring points and connected at a current transformer output,
   a shared transmission device, the voltage transformer device and each of the plurality of measuring instruments being interconnected via the shared transmission device, the shared transmission device digitally transmitting predefined information pertaining to detected voltages to the first of each of the measuring instruments; and
   at least a third measuring instrument having voltage transformer inputs connected at the same location as the voltage transformers, configured at the voltage-detection site as the voltage transformer device, and configured to produce the predefined information pertaining to the detected voltages.

2. The measuring system according to claim 1, wherein the predefined information pertaining to the detected voltages includes voltage values and period duration.

3. The measuring system according to claim 1, wherein each of the at least one measuring instruments includes a memory for inputting and storing a phase-angle error.

* * * * *